United States Patent
Hsu et al.

(10) Patent No.: US 9,640,262 B2
(45) Date of Patent: May 2, 2017

(54) HIGHLY SCALABLE SINGLE-POLY NON-VOLATILE MEMORY CELL

(71) Applicant: eMemory Technology Inc., Hsin-Chu (TW)

(72) Inventors: Te-Hsun Hsu, Hsinchu County (TW); Chun-Hsiao Li, Hsinchu County (TW); Hsuen-Wei Chen, Hsinchu (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 14/719,342

(22) Filed: May 22, 2015

(65) Prior Publication Data

US 2016/0013199 A1   Jan. 14, 2016

Related U.S. Application Data

(60) Provisional application No. 62/022,166, filed on Jul. 8, 2014.

(51) Int. Cl.
*H01L 29/788* (2006.01)
*G11C 16/08* (2006.01)
(Continued)

(52) U.S. Cl.
CPC .............. *G11C 16/08* (2013.01); *G11C 16/10* (2013.01); *G11C 16/26* (2013.01); *G11C 17/04* (2013.01); *G11C 17/08* (2013.01); *G11C 17/146* (2013.01); *G11C 17/16* (2013.01); *G11C 17/18* (2013.01); *G11C 29/76* (2013.01); *H01L 23/528* (2013.01); *H01L 27/0629* (2013.01);
(Continued)

(58) Field of Classification Search
CPC ................................................. H01L 27/11524
See application file for complete search history.

(56) References Cited

U.S. PATENT DOCUMENTS 5,717,635 A * 2/1998 Akatsu ................. H01L 27/115
257/314
6,137,723 A * 10/2000 Bergemont ......... G11C 11/5621
257/E27.103

(Continued)

FOREIGN PATENT DOCUMENTS

EP       2 639 816 A1    9/2013
EP         2637199 A1    9/2013
(Continued)

*Primary Examiner* — Igwe U Anya
(74) *Attorney, Agent, or Firm* — Winston Hsu; Scott Margo

(57) ABSTRACT

A nonvolatile memory cell includes a semiconductor substrate, a first OD region, a second OD region, an isolation region separating the first OD region from the second OD region, a PMOS select transistor disposed on the first OD region, and a PMOS floating gate transistor serially connected to the select transistor and disposed on the first OD region. The PMOS floating gate transistor includes a floating gate overlying the first OD region. A memory P well is disposed in the semiconductor substrate. A memory N well is disposed in the memory P well. The memory P well overlaps with the first OD region and the second OD region. The memory P well has a junction depth that is deeper than a trench depth of the isolation region. The memory N well has a junction depth that is shallower than the trench depth of the isolation region.

12 Claims, 9 Drawing Sheets

(51) Int. Cl.

| | |
|---|---|
| *G11C 17/16* | (2006.01) |
| *G11C 17/18* | (2006.01) |
| *H01L 27/112* | (2006.01) |
| *G11C 16/10* | (2006.01) |
| *G11C 16/26* | (2006.01) |
| *G11C 17/04* | (2006.01) |
| *G11C 17/08* | (2006.01) |
| *H01L 23/528* | (2006.01) |
| *H01L 27/06* | (2006.01) |
| *H01L 29/10* | (2006.01) |
| *H01L 29/49* | (2006.01) |
| *H01L 29/93* | (2006.01) |
| *H01L 27/11524* | (2017.01) |
| *H03K 3/356* | (2006.01) |
| *G11C 17/14* | (2006.01) |
| *G11C 29/00* | (2006.01) |
| *H01L 23/525* | (2006.01) |

(52) U.S. Cl.
CPC .. *H01L 27/11206* (2013.01); *H01L 27/11524* (2013.01); *H01L 29/1079* (2013.01); *H01L 29/4916* (2013.01); *H01L 29/93* (2013.01); *H03K 3/356182* (2013.01); *H01L 23/5252* (2013.01); *H01L 2924/0002* (2013.01)

(56) References Cited

U.S. PATENT DOCUMENTS

| | | | |
|---|---|---|---|
| 6,649,453 | B1 | 11/2003 | Chen |
| 6,724,065 | B2 * | 4/2004 | Sato ................... G11C 11/412 257/296 |
| 2003/0147277 | A1 * | 8/2003 | Hsu ......................... G11C 7/20 365/185.01 |
| 2005/0030827 | A1 * | 2/2005 | Gilliland ............ G11C 16/3404 365/232 |
| 2006/0118854 | A1 * | 6/2006 | Lee ..................... H01L 27/105 257/315 |
| 2008/0138947 | A1 * | 6/2008 | Yang ................. H01L 27/14621 438/241 |
| 2010/0127318 | A1 | 5/2010 | Noort |
| 2010/0329016 | A1 * | 12/2010 | Taniguchi .......... G11C 16/0433 365/185.18 |
| 2011/0309421 | A1 * | 12/2011 | Luan ..................... G11C 17/16 257/314 |
| 2013/0234227 | A1 * | 9/2013 | Chen ................. H01L 29/42328 257/320 |
| 2013/0237048 | A1 * | 9/2013 | Hsu ..................... H01L 29/401 438/593 |
| 2013/0248973 | A1 * | 9/2013 | Chen ................. H01L 27/11517 257/320 |

FOREIGN PATENT DOCUMENTS

| | | |
|---|---|---|
| JP | 2005537649 A | 12/2005 |
| JP | 20119454 A | 1/2011 |
| JP | 2013187534 A | 9/2013 |
| JP | 2013191826 A | 9/2013 |

* cited by examiner

9,640,262 B2

HIGHLY SCALABLE SINGLE-POLY NON-VOLATILE MEMORY CELL

CROSS REFERENCE TO RELATED APPLICATIONS

This application claims priority from U.S. provisional application No. 62/022,166 filed Jul. 8, 2014, which is incorporated herein by reference in its entirety.

BACKGROUND OF THE INVENTION

1. Field of the Invention

The present invention relates generally to the field of semiconductor memory technology. More specifically, the present invention relates to a highly-scalable, single-poly non-volatile memory (NVM) cell having reduced memory cell size (<1 $\mu m^2$) without degradation of memory characteristics.

2. Description of the Prior Art

Semiconductor memory devices have become more popular for use in various electronic devices. For example, non-volatile memory (NVM) is widely used in cellular telephones, digital cameras, personal digital assistants, mobile computing devices, and other devices.

Generally, NVM may be divided into multi-time programmable (MTP) memory and one-time programmable (OTP) memory. MTP memory is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC), for example.

There is a trend to make smaller and smaller NVM devices. As the NVM devices become smaller, it is anticipated that the cost per bit of a memory system will be reduced. However, the scalability of the prior art NVM cell is limited by the rule of implanting I/O ion wells that are implanted into the substrate to a junction depth that is deeper than the depth of the shallow trench isolation (STI) in the memory array region.

SUMMARY OF THE INVENTION

It is one objective of the invention to provide an improved single-poly, multi-time programmable (MTP) non-volatile memory cell that has reduced memory cell size smaller than 1 $\mu m^2$.

It is another objective of the invention to provide an improved single-poly non-volatile memory cell having a reduced memory cell size that is not limited by the implantation rule of I/O ion wells.

According to one aspect of the invention, a nonvolatile memory (NVM) cell includes a semiconductor substrate, a first OD region, a second OD region, an isolation region separating the first OD region from the second OD region, a PMOS select transistor on the first OD region, and a PMOS floating gate transistor serially connected to the select transistor and disposed on the first OD region. The PMOS floating gate transistor comprises a floating gate overlying the first OD region. A memory P well is disposed in the semiconductor substrate. A memory N well is disposed in the memory P well. The memory P well overlaps with the first OD region and the second OD region. The memory P well has a junction depth that is deeper than the trench depth of the isolation region. The memory N well merely overlaps with the first OD region. The memory N well has a junction depth that is shallower than the trench depth of the isolation region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
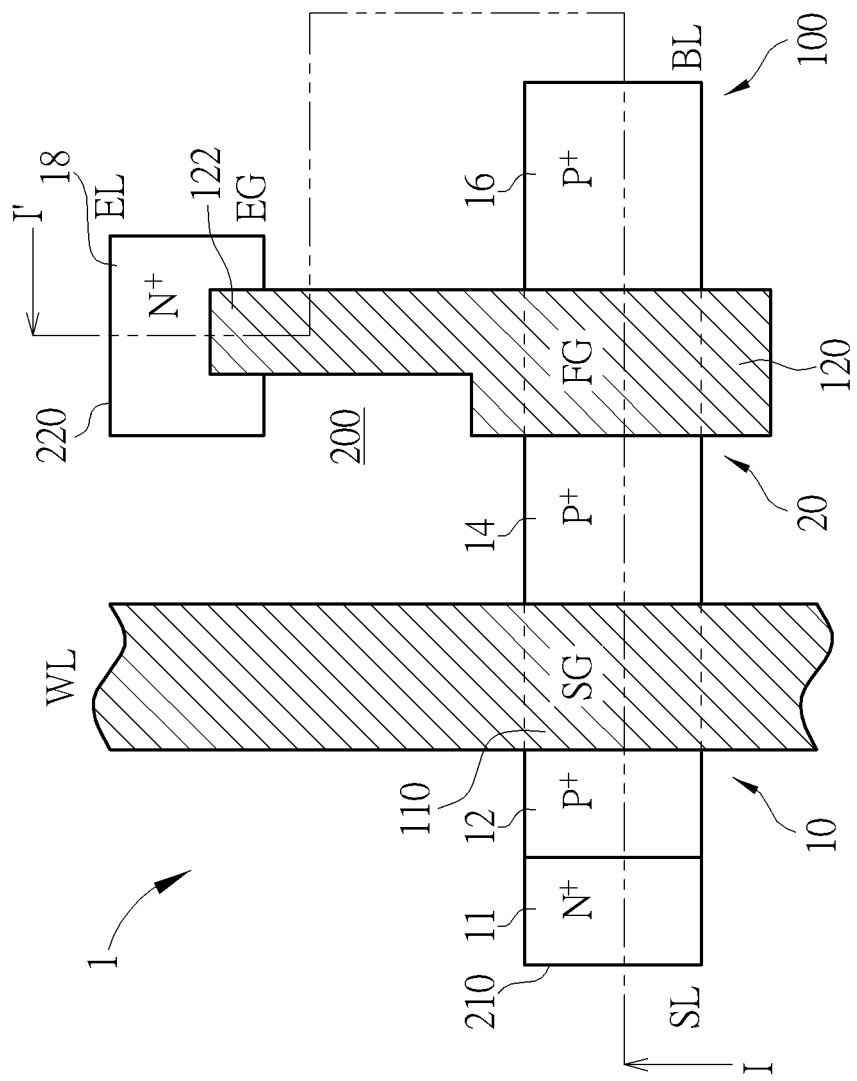
FIG. 1 is a schematic layout diagram showing an exemplary single-poly non-volatile memory cell according to one embodiment of the invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS)

or a shallow trench isolation (STI) region. The term "oxide define (OD) region" is also commonly referred to as an "active area" where the active circuit elements such as transistors are formed and operated.

Figure 2:
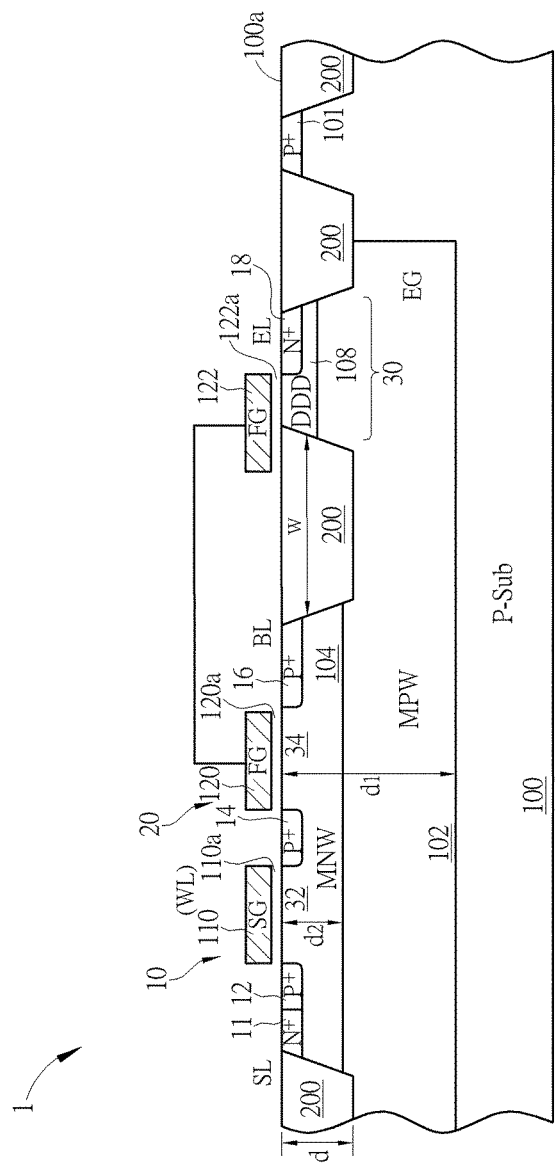
FIG. 2 is a schematic, cross-sectional diagram showing a single-poly non-volatile memory cell taken along line I-I' of FIG. 1.

FIG. 1 is a schematic plan view showing an exemplary layout of a single-poly nonvolatile memory cell in accordance with one embodiment of this invention. FIG. 2 is a schematic, cross-sectional view taken along line I-I' of FIG. 1. The demonstrated NVM cell structure may function as a multi-time programmable (MTP) memory unit. It is to be understood that the present invention may be applicable to other memory devices.

As shown in FIG. 1, the NVM cell 1 comprises at least two spaced-apart oxide define (OD) regions arranged in close proximity to each other. The two spaced-apart OD regions includes a first OD region 210 and a second OD region 220 separated from the first OD region 210 by an isolation region 200 that is embedded in a main surface of a semiconductor substrate 100 such as a P type doped silicon substrate (P-Sub). According to the illustrative embodiment, the isolation region 200 may be a shallow trench isolation (STI) region, but should not be limited thereto. It is to be understood that the layout in FIG. 1 is for illustrative purposes only.

According to the illustrative embodiment, the isolation region 200 between the first OD region 210 and the second OD region 220 may have a width w that is equal to or less than 0.25 micrometers, but not limited thereto. According to the illustrative embodiment, the width w between the isolation region 200 between the first OD region 210 and the second OD region 220 is not limited by the implantation rule of input/output (I/O) ion wells. According to the illustrative embodiment, the I/O ion wells are not used in the memory array.

As can be seen in FIG. 1 and FIG. 2, the NVM cell 1 comprises a select transistor 10 and a floating gate transistor 20 that is serially connected to the select transistor 10. The serially connected select transistor 10 and the floating gate transistor 20 may be formed directly on the first OD region 101. According to the illustrative embodiment, the select transistor 10 may be a PMOS transistor and comprises a P$^+$ source doping region 12 (coupled to a source line SL), a common P$^+$ doping region 14 spaced apart from the P$^+$ source doping region 12, a select gate channel region 32 near the main surface of the semiconductor substrate 100 between the P$^+$ source doping region 12 and the common P$^+$ doping region 14, a select gate (SG) 110 coupled to a wordline (WL) overlying the select gate channel region 32, and a gate dielectric layer 110a between the select gate 110 and the select gate channel region 32. Sidewall spacers (not shown) may be formed on opposite sidewalls of the select gate 110.

According to the illustrative embodiment, an N$^+$ doping region 11 is disposed next to the P$^+$ source doping region 12. The N$^+$ doping region 11 may be contiguous with the P$^+$ source doping region 12. A butted contact (not shown) may be formed to short the N$^+$ doping region 11 with the P$^+$ source doping region 12.

The floating gate transistor 20 is formed directly on the first OD region 210 that is commonly shared by the select transistor 10 and the floating gate transistor 20. The floating gate transistor 20 is coupled to the select transistor 10 through the common P$^+$ doping region 14. The common P$^+$ doping region 14 is shared by the floating gate transistor 20 and the select transistor 10, thereby forming two serially connected transistors, and in this case, two serially connected PMOS transistors.

The floating gate transistor 20 comprises a floating gate (FG) 120 overlying the first OD region 210. According to the illustrative embodiment, the floating gate 120 consists of one and only one layer of polysilicon (i.e. single-poly). According to the illustrative embodiment, the floating gate transistor 20 serves as the charge storage element of the NVM cell 1. According to the illustrative embodiment, both of the select gate 110 and the floating gate 120 are straight line-shaped and extend parallel to each other.

The floating gate transistor 20 further comprises the common P$^+$ doping region 14 on one side of the floating gate (FG) 120, a P$^+$ drain doping region 16 on the other side of the floating gate 120, a floating gate channel region 34 between the common P$^+$ doping region 14 and the P$^+$ drain doping region 16 (coupled to a bit line BL), and a gate dielectric layer 120a between the floating gate 120 and the floating gate channel region 34. According to the illustrative embodiment, the gate dielectric layer 120a has a thickness that is substantially equal to that of the gate dielectric layer 110a.

According to the illustrative embodiment, the NVM cell 1 further comprises a floating gate extension 122 continuously extended from the floating gate 120 to the second OD region 220 and is adjacent to an erase gate (EG) region 30 (coupled to an erase line EL). The floating gate extension 122 traverses the isolation region 200 between the first OD region 210 and the second OD region 220 and partially overlaps with the second OD region 220 to capacitively couple to the EG region 30. According to the illustrative embodiment, the EG region 30 comprises a double diffused drain (DDD) region 108 and an N$^+$ doping region 18 in the DDD region 108. According to the illustrative embodiment, a gate dielectric layer 122a may be formed between the floating gate extension 122 and the DDD region 108.

According to the illustrative embodiment, the DDD region 108 may be an N-type doping region. According to the illustrative embodiment, the N$^+$ doping region 18 is formed in an area that is not covered by the floating gate extension 122. In operation, the N$^+$ doping region 18 and the DDD region 108 are electrically coupled to an erase line voltage ($V_{EL}$). According to the illustrative embodiment, the DDD region 108 in the EG region 30 is able to increase junction breakdown voltage.

According to the illustrative embodiment, the NVM cell 1 further comprises a memory P well (MPW) 102 in the semiconductor substrate 100 and a shallow memory N well (MNW) 104 in the MPW 102. According to the illustrative embodiment, the MPW 102 has a junction depth $d_1$ below a main surface 100a of the semiconductor substrate 100 that is deeper than a trench depth d of the isolation region 200 below the main surface 100a of the semiconductor substrate 100. According to the illustrative embodiment, the MNW 104 has a junction depth $d_2$ below the main surface 100a of the semiconductor substrate 100 that is shallower than or equal to the trench depth d of the isolation region 200 below the main surface 100a of the semiconductor substrate 100. According to the illustrative embodiment, trench depth d of the isolation region 200 may range between 2700 and 3700 angstroms, but not limited thereto.

According to the illustrative embodiment, as can be seen in FIG. 2, the select transistor 10 and the floating gate transistor 20 are disposed within the MNW 104. The N$^+$ doping region 11, the P$^+$ source doping region 12, the common P$^+$ doping region 14, and the P$^+$ drain doping region 16 are formed within the MNW 104. The N$^+$ doping region 18 and the DDD region 108 are formed within the MPW 102. According to the illustrative embodiment, the EG region 30 may further comprise a portion of the MPW 102 that is directly underneath the DDD region 108. According to the illustrative embodiment, a P+ pick-up region 101 may be provided to electrically couple the semiconductor substrate 100 to a substrate voltage ($V_{SUB}$).

FIGS. 3-9 are schematic, cross-sectional diagrams showing the exemplary steps of forming the MNW 104, MPW 102, and DDD region 108 in the semiconductor substrate 100 according to one embodiment of the invention, wherein like numeral numbers designate like layers, regions, and elements. According to the illustrative embodiment, two extra photo masks may be needed to form the MNW 104, MPW 102, and DDD region 108 in the semiconductor substrate 100.

Figure 3:
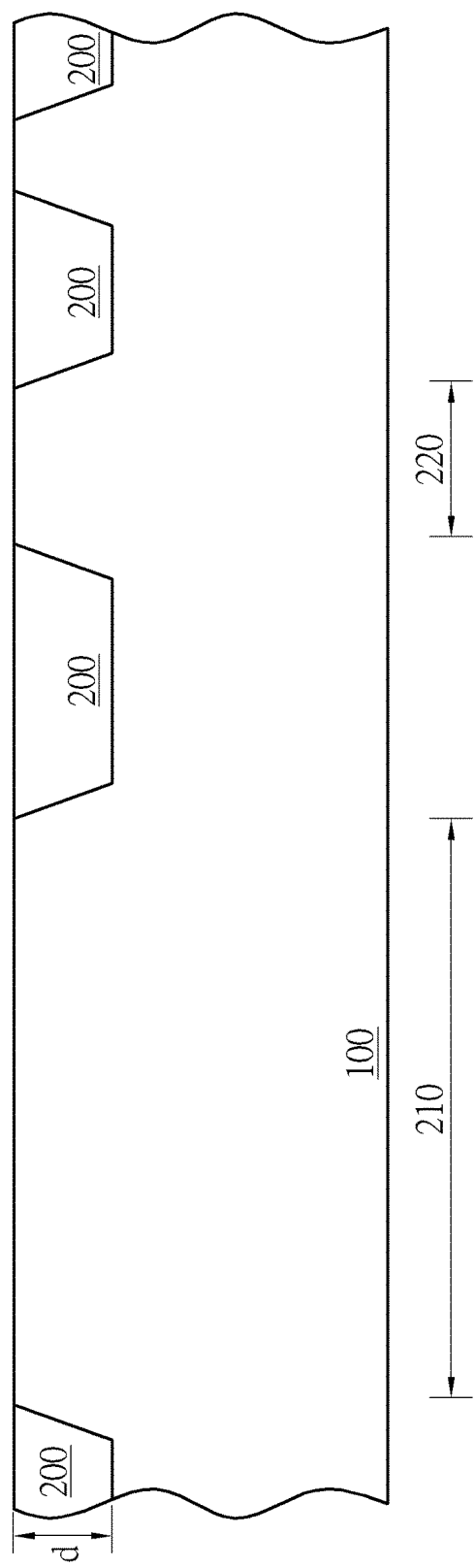
FIGS. 3-9 are schematic, cross-sectional diagrams showing the exemplary steps of forming the MNW, MPW, and DDD region in the semiconductor substrate according to one embodiment of the invention.

As shown in FIG. 3, isolation region 200 such as shallow trench isolation (STI) is formed in the semiconductor substrate 100 and the first OD region 210 and the second OD region 220 are defined on the main surface 100a of the semiconductor substrate 100. As previously mentioned, the trench depth d of the isolation region 200 may range between 2700 and 3700 angstroms, for example.

Figure 4:
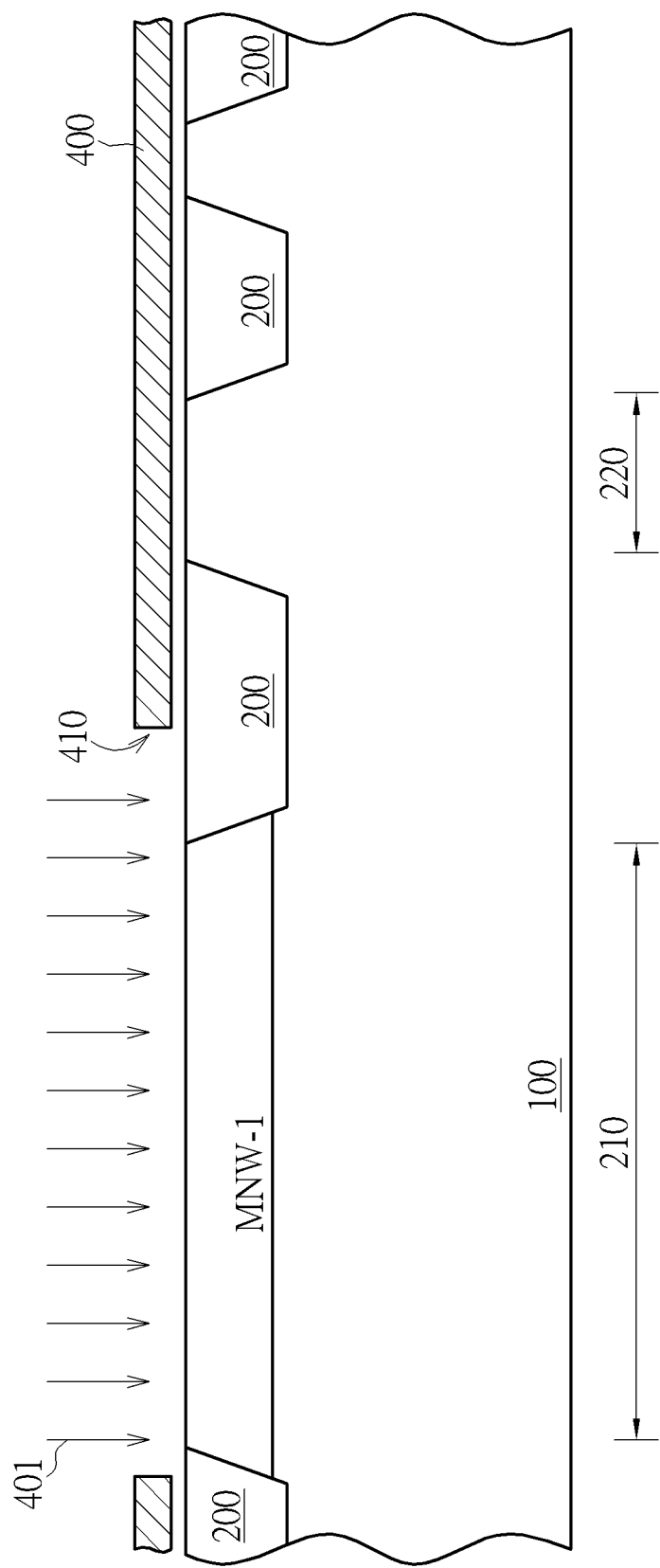

As shown in FIG. 4, a first implant mask 400 is provided overlying the semiconductor substrate 100. The first implant mask 400 may have an opening 410 that defines the area to be implanted as the memory N well. An ion implantation process 401 is performed to implant N-type dopants into the semiconductor substrate 100 through the opening 410, thereby forming a first shallow memory N well (MNW-1) for anti-punch through. According to the illustrative embodiment, the first shallow memory N well (MNW-1) has a junction depth that is shallower than the trench depth d of the isolation region 200.

Figure 5:
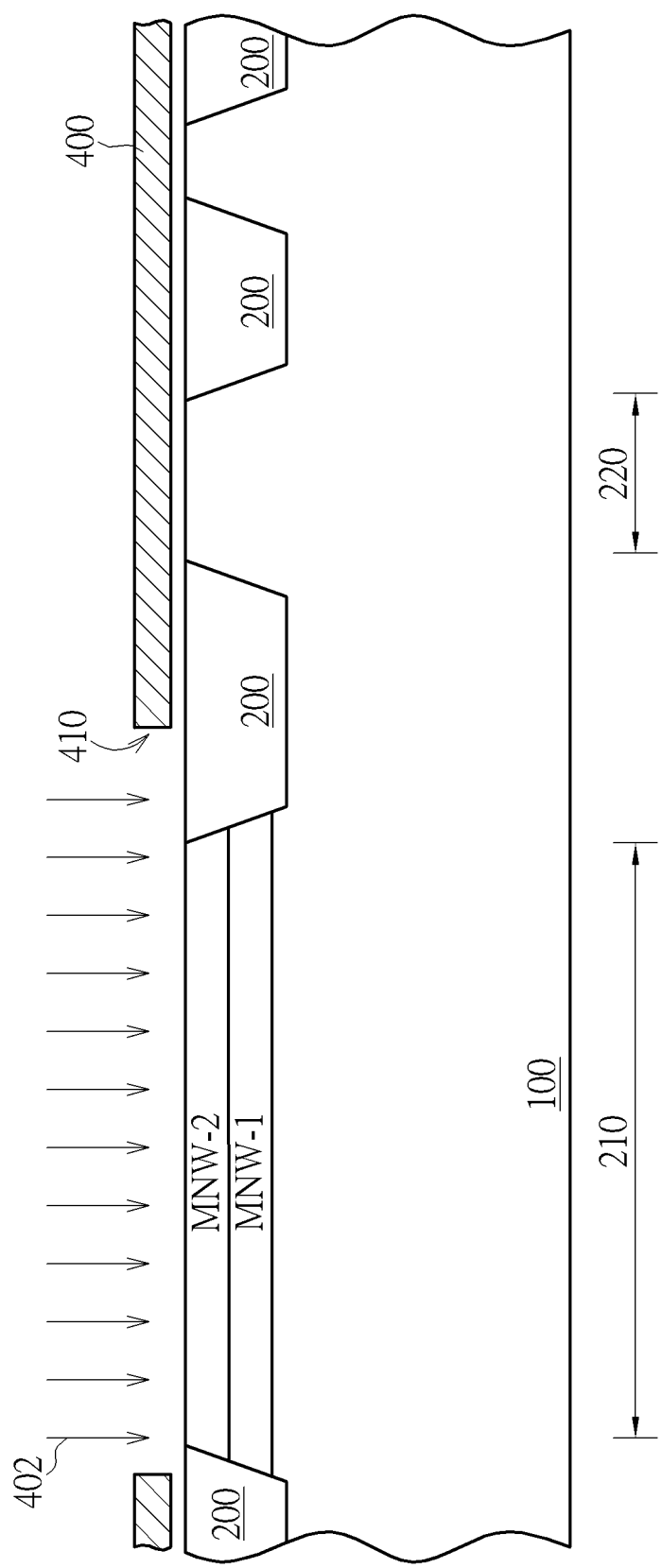

As shown in FIG. 5, subsequently, the first implant mask 400 is used again in an ion implantation process 402. A second shallow memory N well (MNW-2) for threshold voltage (Vt) adjustment is formed in the first shallow memory N well (MNW-1). According to the illustrative embodiment, the second shallow memory N well (MNW-2) has a junction depth that is shallower than that of the first shallow memory N well (MNW-1).

Figure 6:
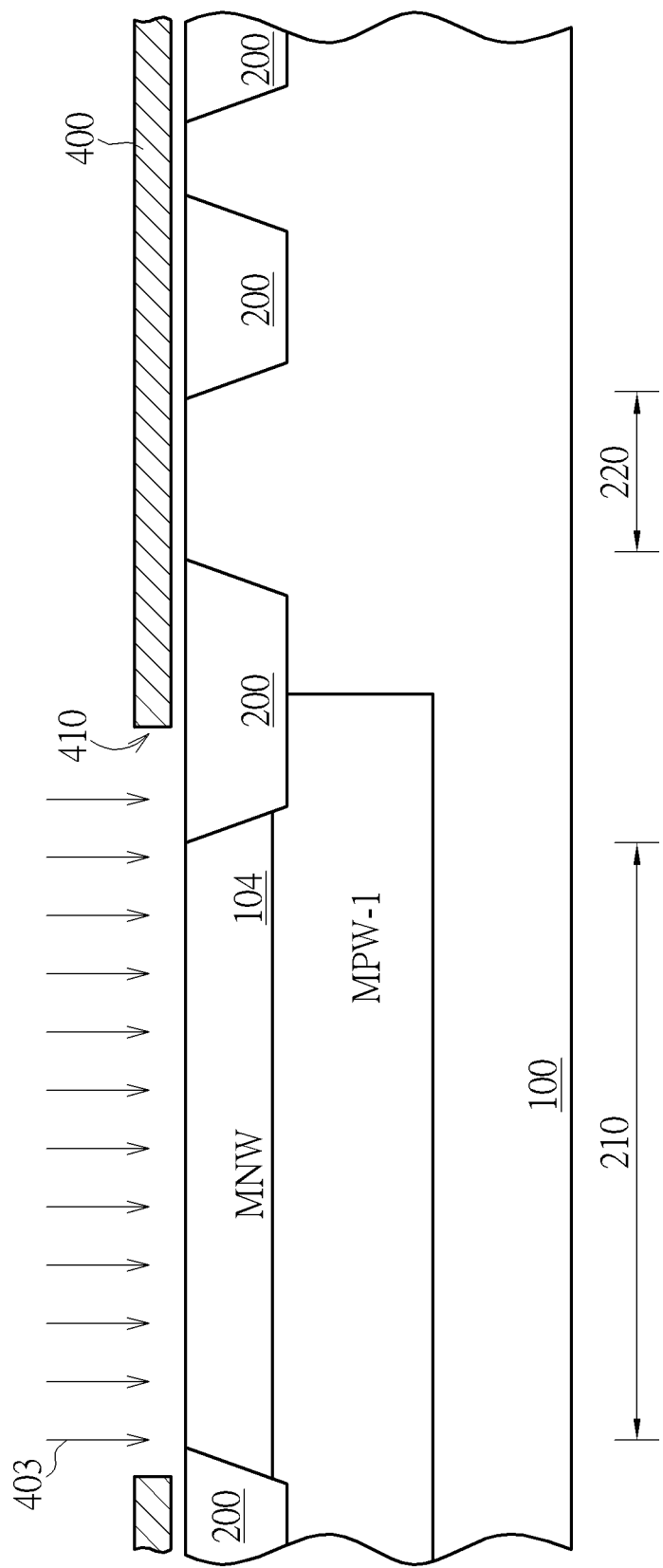

As shown in FIG. 6, subsequently, the first implant mask 400 is used again in an ion implantation process 403. A first memory P well (MPW-1) for isolation is formed in the semiconductor substrate 100. The first memory P well (MPW-1) has a junction depth that is deeper than that of the first shallow memory N well (MNW-1) and is deeper than the trench depth d of the isolation region 200. Thereafter, the first implant mask 400 is removed.

Figure 7:
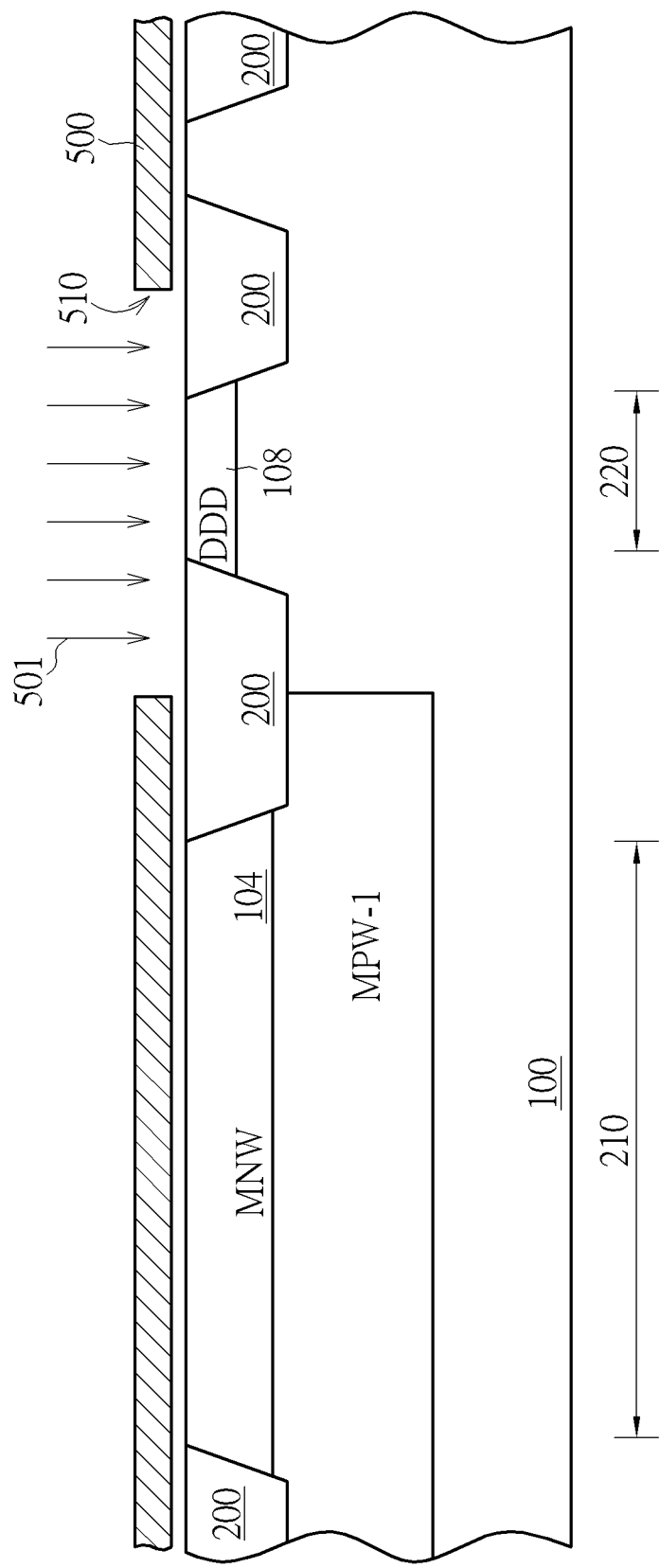

As shown in FIG. 7, a second implant mask 500 is then provided overlying the semiconductor substrate 100. The second implant mask 500 may have an opening 510 that defines the area to be implanted as an N-type double diffused drain (DDD) region. An ion implantation process 501 is performed to implant N-type dopants into the semiconductor substrate 100 through the opening 510, thereby forming the N-type double diffused drain (DDD) region 108.

Figure 8:
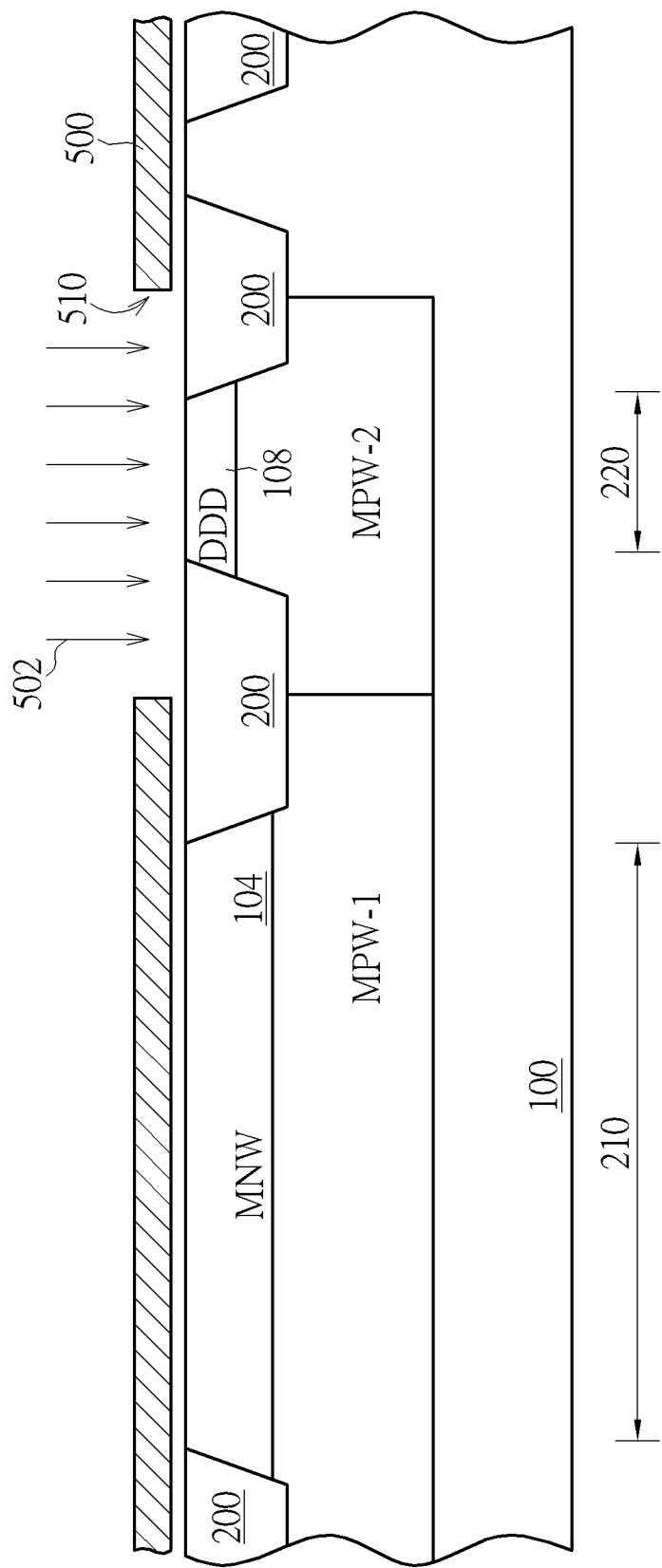

As shown in FIG. 8, subsequently, the second implant mask 500 is used again in an ion implantation process 502. P-type dopants are implanted into the semiconductor substrate 100 through the opening 510, thereby forming a second memory P well (MPW-2) for isolation. The second memory P well (MPW-2) has a junction depth that is deeper than that of the first shallow memory N well (MNW-1) and is deeper than the trench depth d of the isolation region 200.

Figure 9:
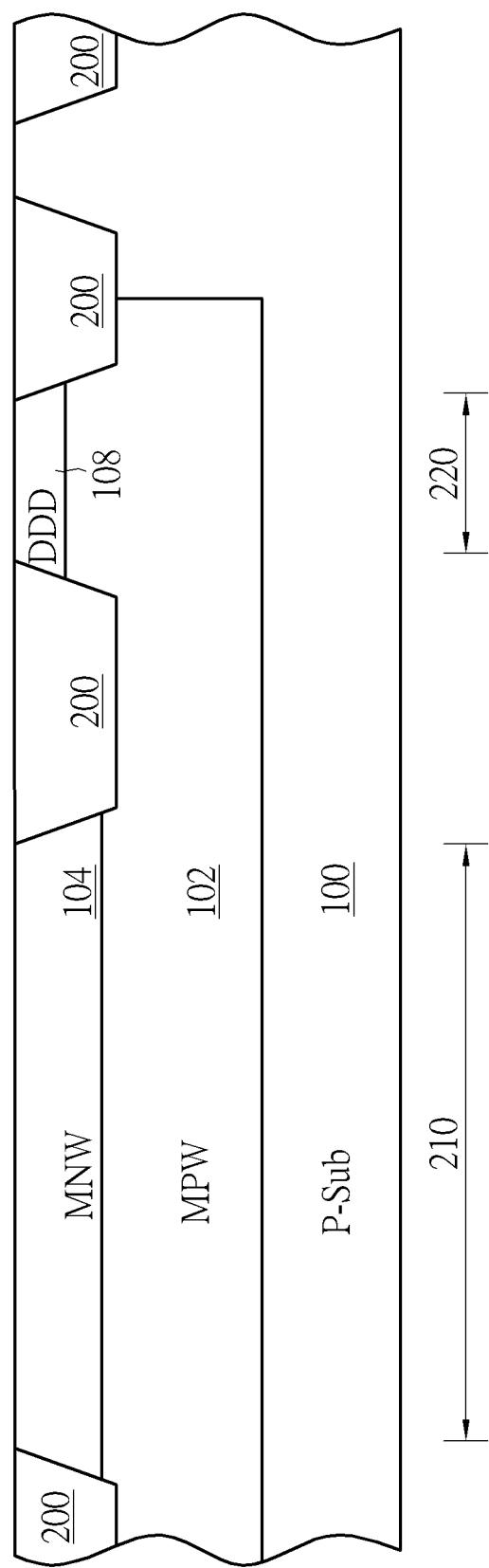

As shown in FIG. 9, the second memory P well (MPW-2) merges with the first memory P well (MPW-1) to constitute the memory P well (MPW) 102. The first shallow memory N well (MNW-1) and the second shallow memory N well (MNW-2) constitute the memory N well (MNW) 104. Subsequently, select transistor, floating gate transistor, and erase gate region are formed on the semiconductor substrate 100 by using process that is compatible with conventional CMOS logic process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nonvolatile memory (NVM) cell, comprising:
a semiconductor substrate;
a first OD region and a second OD region;
an isolation region separating the first OD region from the second OD region, the isolation region having a trench depth;
a PMOS select transistor disposed on the first OD region;
a PMOS floating gate transistor serially connected to the select transistor and being disposed on the first OD region, wherein the PMOS floating gate transistor comprises a floating gate overlying the first OD region;
a memory P well in the semiconductor substrate, wherein the memory P well overlaps with the first OD region and the second OD region, and wherein the memory P well has a junction depth that is deeper than the trench depth of the isolation region, and wherein the memory P well has a continuous well structure between the first OD region and the second OD region;
a memory N well in the memory P well, wherein the memory N well merely overlaps with the first OD region, and wherein the memory N well has a junction depth that is shallower than the trench depth of the isolation region; and
an N+ pickup in the memory N well.

2. The NVM cell according to claim 1, wherein the PMOS select transistor and the PMOS floating gate transistor commonly share the memory N well.

3. The NVM cell according to claim 1, wherein the PMOS select transistor comprises a P+ source doping region in the memory N well, a common P+ doping region spaced apart from the p+ source doping region, a select gate channel region near a main surface of the semiconductor substrate between the P+ source doping region and the common P+ doping region, a select gate overlying the select gate channel region, and a gate dielectric layer between the select gate and the select gate channel region.

4. The NVM cell according to claim 3, wherein the P+ source doping region is coupled to a source line SL.

5. The NVM cell according to claim 1, wherein the PMOS floating gate transistor further comprises a common P+ doping region on one side of the floating gate, a P+ drain doping region on the other side of the floating gate, a floating gate channel region between the common P+ doping region and the P+ drain doping region, and a gate dielectric layer between the floating gate and the floating gate channel region.

6. The NVM cell according to claim 5, wherein the P+ drain doping region is coupled to a bit line BL.

7. The NVM cell according to claim 1, wherein the PMOS floating gate transistor serves as a charge storage element of the NVM cell.

8. The NVM cell according to claim 1 further comprising a floating gate extension continuously extended from the floating gate to the second OD region and is adjacent to an erase gate (EG) region in the second OD region.

9. The NVM cell according to claim 8, wherein the floating gate extension traverses the isolation region between the first OD region and the second OD region and partially overlaps with the second OD region to capacitively couple to the EG region.

10. The NVM cell according to claim 8, wherein the EG region comprises a double diffused drain (DDD) region and an $N^+$ doping region in the DDD region.

11. The NVM cell according to claim 10, wherein the DDD region is an N-type doping region.

12. The NVM cell according to claim 10, wherein the $N^+$ doping region and the DDD region are electrically coupled to an erase line voltage ($V_{EL}$).

* * * * *